United States Patent
Matsumoto et al.

(10) Patent No.: US 6,949,996 B2
(45) Date of Patent: Sep. 27, 2005

(54) ACTUATOR

(75) Inventors: Kazuya Matsumoto, Kamiina-gun (JP);
Masahiro Katashiro, Hachioji (JP);
Hiroshi Miyajima, Hachioji (JP);
Toshihiko Isokawa, Ina (JP)

(73) Assignee: Olympus Corporation, Tokyo (JP)

( * ) Notice: Subject to any disclaimer, the term of this patent is extended or adjusted under 35 U.S.C. 154(b) by 373 days.

(21) Appl. No.: 10/121,342

(22) Filed: Apr. 12, 2002

(65) Prior Publication Data

US 2002/0149294 A1 Oct. 17, 2002

(30) Foreign Application Priority Data

Apr. 13, 2001 (JP) .......................... 2001-115643

(51) Int. Cl.[7] .............................................. H01H 51/22
(52) U.S. Cl. ......................................... 335/78; 200/181
(58) Field of Search .............................. 359/298, 290, 359/223–225; 335/78; 200/181

(56) References Cited

U.S. PATENT DOCUMENTS

| | | | | |
|---|---|---|---|---|
| 5,629,790 A | * | 5/1997 | Neukermans et al. | ........ 359/198 |
| 5,867,294 A | * | 2/1999 | Sakai | ........................ 398/129 |
| 5,907,425 A | | 5/1999 | Dickensheets et al. | |
| 5,912,608 A | * | 6/1999 | Asada | ........................ 335/222 |
| 6,108,118 A | | 8/2000 | Minamoto | |
| 6,188,504 B1 | | 2/2001 | Murakami et al. | |
| 6,467,345 B1 | * | 10/2002 | Neukermans et al. | .... 73/504.02 |
| 2003/0174035 A1 | * | 9/2003 | Arima | ........................ 335/220 |
| 2004/0075522 A1 | * | 4/2004 | Kato et al. | .................. 336/200 |
| 2005/0046504 A1 | * | 3/2005 | Xiaoyu et al. | .............. 331/154 |

* cited by examiner

Primary Examiner—Lincoln Donovan
Assistant Examiner—Bernard Rojas
(74) Attorney, Agent, or Firm—Scully, Scott, Murphy & Presser

(57) ABSTRACT

A two-dimensional driving actuator comprises a flat spring structure, and a driver for driving the flat spring structure. The flat spring structure includes a moving plate, a moving inner frame surrounding the moving plate, first torsion bars coupling the moving plate and the moving inner frame so as to allow the moving plate to be vibrated relative to the moving inner frame, a fixed outer frame surrounding the moving inner frame, and second torsion bars coupling the moving inner frame and the fixed outer frame so as to allow the moving inner frame to be vibrated relative to the fixed outer frame. The flat spring structure is manufactured from a single semiconductor substrate. The first and second torsion bars are made of different materials.

8 Claims, 3 Drawing Sheets

ACTUATOR

CROSS-REFERENCE TO RELATED APPLICATIONS

This application is based upon and claims the benefit of priority from the prior Japanese Patent Application No. 2001-115643, filed Apr. 13, 2001, the entire contents of which are incorporated herein by reference.

BACKGROUND OF THE INVENTION

1. Field of the Invention

The present invention relates to an actuator having a flat spring structure including a vibratingly moving plate, which is manufactured by micromachining using semiconductor-manufacturing technology.

2. Description of the Related Art

Since the above actuator can be manufactured very small, it is often used for manufacturing micro-sized optical scanners. The optical scanner includes a vibratingly moving plate, and the moving plate has a mirror for reflecting a light beam. As the moving plate moves, the optical scanner scans the light beam reflected by the mirror.

A typical actuator for use in an optical scanner that performs two-dimensional scanning has a so-called gimbal-type flat spring structure, which comprises a moving plate supported vibratingly about two axes. In other words, the flat spring structure includes a moving plate, a moving inner frame surrounding the moving plate, a pair of first torsion bars coupling the moving plate and moving inner frame so as to allow the moving plate to be vibrated relative to the moving inner frame, a fixed outer frame surrounding the moving inner frame, and a pair of second torsion bars coupling the moving inner frame and fixed outer frame so as to allow the moving inner frame to be vibrated relative to the fixed outer frame.

In the foregoing actuator, the moving plate is usually vibrated by electromagnetic driving or electrostatic driving. In an electromagnetic driving type actuator, a moving plate and a moving inner frame include an electromagnetic coil. A permanent magnet applies a magnetic field to the electromagnetic coil. In an electrostatic driving type actuator, a moving plate and a moving inner frame include a pair of driving electrodes, respectively, and a fixed electrode is provided opposite to the driving electrodes.

A new technique, in which a laser projector uses the above optical scanner, is known. Basically the laser projector includes a light source for emitting a light beam, and an optical scanner for scanning the light beam two-dimensionally.

The laser projector requires an about-three-digit difference between the horizontal scanning frequency and vertical scanning frequency. In the flat spring structure of the two-dimensional driving actuator used in the optical scanner, therefore, the first and second torsion bars need to have greatly different resonance frequencies.

In a prior art flat spring structure manufactured by micromachining, first and second torsion bars are usually made of the same material. The resonance frequencies of the first and second torsion bars are inevitably similar to each other. Thus, a two-dimensional driving actuator using the prior art flat spring structure cannot meet laser projector design requirements.

The optical scanner preferably has a function of detecting a two-dimensional inclination of the moving plate or a deflection angle. In the electrostatic driving type optical scanner, a two-dimensional inclination of the moving plate is obtained by measuring the capacitance between the fixed electrode and the four driving electrodes.

In a prior art electrostatic driving type actuator, generally, driving electrodes are provided on the moving plate and the moving inner frame, and a member that supports the flat spring structure is formed of a silicon substrate, which serves as an electrode. The driving electrodes are electrically connected to an external circuit through wires formed on the silicon substrate with a thin insulation film interposed therebetween. Due to this arrangement, parasitic capacitance is caused between the wire and the silicon substrate, which decreases the measurement precision of capacitance or detection precision of inclination of the moving plate.

BRIEF SUMMARY OF THE INVENTION

An object of the present invention is to provide a two-dimensional driving actuator for use in an optical scanner, which is favorably applied to a laser projector, the driving actuator having a flat spring structure including first and second torsion bars whose resonance frequencies greatly differ from each other.

A two-dimensional driving actuator according to the present invention comprises a flat spring structure including a moving plate, a moving inner frame surrounding the moving plate, first torsion bars coupling the moving plate and the moving inner frame so as to allow the moving plate to be vibrated relative to the moving inner frame, a fixed outer frame surrounding the moving inner frame, and second torsion bars coupling the moving inner frame and the fixed outer frame so as to allow the moving inner frame to be vibrated relative to the fixed outer frame, the flat spring structure being manufactured from a single semiconductor substrate, and the first and second torsion bars being made of different materials; and driving means for driving the flat spring structure.

In a preferred embodiment, the semiconductor substrate comprises a plurality of layers, which are made of materials varying in stiffness, the first torsion bars are chiefly constituted by a layer of a high-stiffness material, and the second torsion bars are chiefly constituted by a layer of a low-stiffness material.

In another preferred embodiment, the semiconductor substrate includes a layer of silicon material and a layer of organic insulating material, the first torsion bars are chiefly constituted by the layer of silicon material, and the second torsion bars are chiefly constituted by the layer of organic insulating material.

According to the present invention, a two-dimensional driving actuator is provided, the driving actuator having a flat spring structure including first and second torsion bars whose resonance frequencies greatly differ from each other, such that the driving actuator is favorably applied to a laser projector.

Another object of the present invention is to provide an actuator having a moving plate, the actuator including wiring patterns with low undesired parasitic capacitance, such that an inclination of the moving plate is detected by measuring capacitance with high precision.

Another two-dimensional driving actuator according to the present invention comprises a flat spring structure including a moving plate, a moving inner frame surrounding the moving plate, first torsion bars coupling the moving plate and the moving inner frame so as to allow the moving plate to be vibrated relative to the moving inner frame, a fixed outer frame surrounding the moving inner frame, second torsion bars coupling the moving inner frame and the fixed outer frame so as to allow the moving inner frame to be vibrated relative to the fixed outer frame, an electrode provided on the moving plate, and an electrode provided on the moving inner frame; and an insulating substrate supporting the flat spring structure, the insulating substrate including a recess to provide a space, which allows the moving plate to be vibrated, a plurality of driving electrodes provided on a bottom of the recess, and a plurality of wiring patterns extending from the driving electrodes, the wiring patterns having a line width smaller than that of the driving electrodes, and the actuator detecting an inclination of the moving plate by checking capacitance of the driving electrodes.

According to the present invention, an actuator having a moving plate is provided, the actuator including wiring patterns with low undesired parasitic capacitance, such that an inclination of the moving plate is detected by measuring capacitance with high precision.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

A first embodiment of the present invention will be described with reference to FIG. 1. The first embodiment is directed to an actuator for use in a light deflector that deflects or scans a light beam two-dimensionally. More specifically, the first embodiment is directed to a two-dimensional driving actuator of an electromagnetic driving type that is capable of two-dimensionally vibrating a moving plate about two axes intersecting at right angles, the moving plate having a reflection surface for reflecting a light beam.

Figure 1:
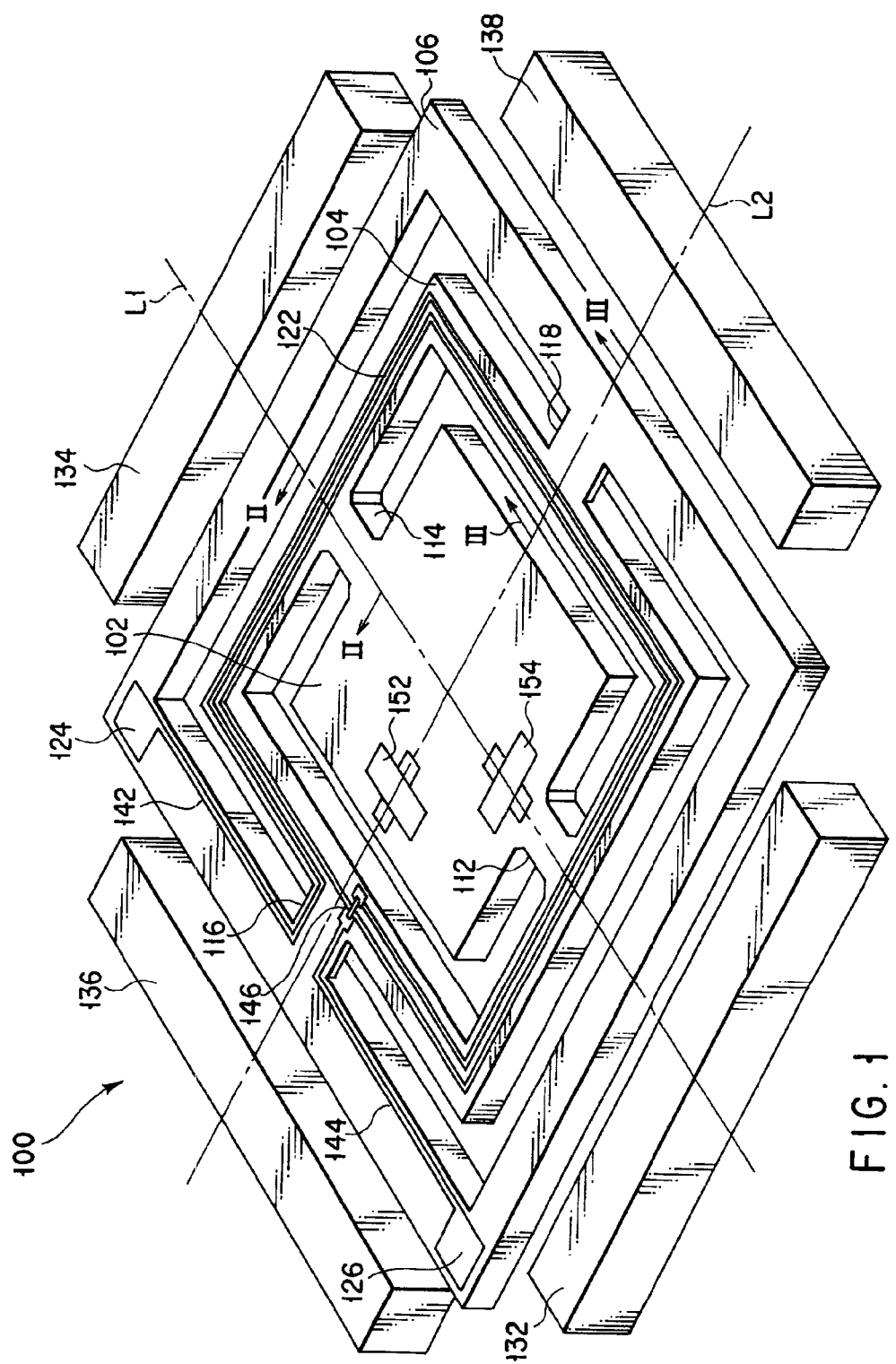
FIG. 1 is a perspective view schematically showing a structure of an actuator according to a first embodiment of the present invention.

As shown in FIG. 1, an actuator 100 comprises a flat spring structure. The flat spring structure includes a moving plate 102, a moving inner frame 104 surrounding the moving plate 102, a pair of first torsion bars 112 and 114 coupling the moving plate 102 and moving inner frame 104 to each other, a fixed outer frame 106 surrounding the moving inner frame 104, and a pair of second torsion bars 116 and 118 coupling the moving inner frame 104 and fixed outer frame 106 to each other. The flat spring structure is manufactured from a single semiconductor substrate by micromachining, for example.

The pair of first torsion bars 112 and 114 supports the moving plate 102, allowing the moving plate 102 to be vibrated about a first axis $L_1$ relative to the moving inner frame 104. On the other hand, the pair of second torsion bars 116 and 118 supports the moving inner frame 104, allowing the moving inner frame 104 to be vibrated about a second axis L2 relative to the fixed outer frame 106.

The first and second axes $L_1$ and $L_2$ both pass the center of the moving plate 102, extending not in parallel to each other, e.g., intersecting at right angles. Therefore, the moving plate 102 can be vibrated about the second axis $L_2$ together with the moving inner frame 104 relative to the fixed outer frame 106 and solely vibrated about the axis $L_1$ relative to the moving inner frame 104. In other words, the moving plate 102 can be directed in an arbitrary direction within a given range of angle to the fixed outer frame 106.

The moving plate 102 has a total reflection mirror on its underside, which is a reverse side of the surface shown in FIG. 1.

The moving plate 102 is vibrated about the first axis at a relatively high speed and it is vibrated about the second axis at a relatively low speed. Thus, the first torsion bars 112 and 114 have a relatively high resonance frequency, which is suitable for high-speed vibration, while the second torsion bars 116 and 118 have a relatively low resonance frequency, which is suitable for low-speed vibration.

In order to apply the actuator to a laser projector or the like, the torsion bars for high-speed vibration desirably have a resonance frequency that is comparable to the horizontal drive frequency (about 15 KHz) of a CRT and the torsion bars for low-speed vibration desirably have a resonance frequency that is comparable to the vertical drive frequency (about 30 Hz) of a CRT.

The first torsion bars 112 and 114 and the second torsion bars 116 and 118 are therefore made of different materials. More specifically, the first torsion bars 112 and 114 are made of a material suitable for high-speed vibration and the second torsion bars 116 and 118 are made of a material suitable for low-speed vibration. The former material is a semiconductor material such as monocrystalline silicon and the latter material is an organic insulating material such as polyimide, for example.

Figure 2:
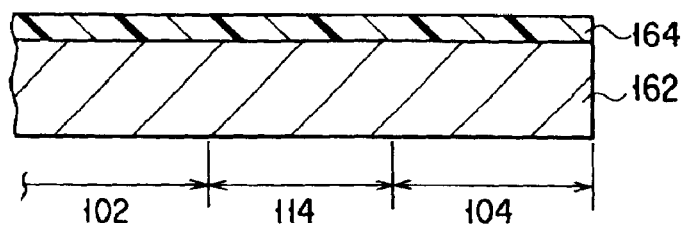
FIG. 2 is a partially sectional view of a flat spring structure taken along line II—II of FIG. 1 in order to show the section of a first torsion bar.
Figure 3:
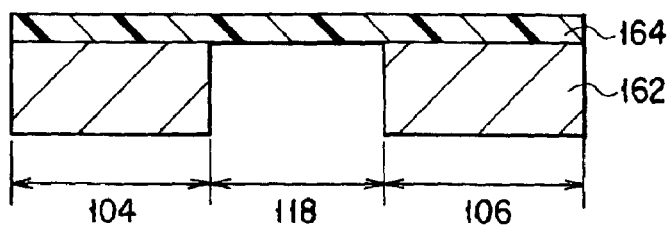
FIG. 3 is a sectional view of the flat spring structure taken along line III—III of FIG. 1 in order to show the section of a second torsion bar.

The first torsion bars 112 and 114 are chiefly constituted by monocrystalline silicon 162 having relatively high stiffness, such that the first torsion bars 112 and 114 have a high resonance frequency, as is seen from FIG. 2 showing a section of one of the first torsion bars. The second torsion bars 116 and 118 are chiefly constituted by polyimide 164 having relatively low stiffness, such that the second torsion bars 116 and 118 have a low resonance frequency, as is seen from FIG. 3 showing a section of one of the torsion bars.

The resonance frequencies of the first torsion bars 112 and 114 and the second torsion bars 116 and 118 are each optimized so as to have a desired value in consideration of their materials and dimensions such as thickness, width and length, and the mass of the moving plate.

U.S. Pat. No. 6,188,504, which was filed by the same applicant as that of the present application, discloses in detail a method of manufacturing a flat spring structure having monocrystalline silicon torsion bars and polyimide torsion bars. The entire contents of the Patent are incorporated herein by reference.

The actuator 100 includes a driving coil 122, which rotates around the moving inner frame 104, a pair of first permanent magnets 132 and 134 for providing a magnetostatic field parallel to the first axis, and a pair of second permanent magnets 136 and 138 for providing a magnetostatic field parallel to the second axis. The driving coil 122 and permanent magnets 132, 134, 136 and 138 constitute a driving means of the actuator 100. The first permanent magnets 132 and 134 are arranged on both sides of the flat spring structure in parallel to the second axis. The second permanent magnets 136 and 138 are arranged on both sides of the flat spring structure in parallel to the first axis.

The first permanent magnets 132 and 134 are preferably coupled to a yoke (not shown). Similarly, the second permanent magnets 136 and 138 are preferably coupled to a yoke (not shown). The yokes extend so as not to block a light beam incident upon the moving plate or its reflected light beam. If a sufficiently strong magnetic field is generated without the yokes, the yokes may be excluded. Instead of two pairs of permanent magnets corresponding to two pairs of opposing sides of the flat spring structure, a pair of permanent magnets may be arranged in a diagonal direction of the flat spring structure.

The actuator 100 includes a pair of electrode pads 124 and 126 for supplying a current to the driving coil 122. The electrode pads 124 and 126 are both provided on the fixed outer frame 106. The electrode pad 124 is electrically connected to an outer end portion of the driving coil 122 via wiring 142 extending on the fixed outer frame 106 and torsion bar 116. The electrode pad 126 is electrically connected to an inner end portion of the driving coil 122 via wiring 144 extending on the fixed outer frame 106 and the torsion bar 116 and via jump wiring 146 extending on the driving coil 122 through the insulation film.

The driving coil 122 is supplied with an alternating current containing high- and low-frequency components through the pair of electrode pads 124 and 126. The high-frequency component has only to have a frequency that is equal to resonance frequency $f_{r1}$ of the first torsion bars 112 and 114, while the low-frequency component has only to have a frequency that is equal to resonance frequency $f_{r2}$ of the second torsion bars 116 and 118. Instead, the high-frequency component may have a frequency that is equal to $f_{r1}/(2n+1)$ where n is natural number, while the low-frequency component may have a frequency that is equal to $f_{r2}/(2m+1)$ where m is natural number.

The moving inner frame 104 is vibrated about the second axis at a frequency corresponding to the resonance frequency $f_{r2}$ of the second torsion bars 116 and 118 by the Lorentz force generated by the interaction between a current flowing through the driving coil 122 and a magnetic field generated by the first permanent magnets 132 and 134.

Small vibration is induced by the Lorentz force generated by the interaction between a current flowing through the driving coil 122 and a magnetic field generated by the second permanent magnets 136 and 138. The moving plate 102 is vibrated about the first axis at a frequency corresponding to the resonance frequency $f_{r1}$ of the first torsion bars 112 and 114 by the resonance of the moving inner frame 104 due to the small vibration.

Consequently, the moving plate 102 is vibrated alone about the first axis at the frequency that depends upon the resonance frequency of the first torsion bars 112 and 114 and also vibrated together with the moving plate 104 about the second axis at the frequency that depends upon the resonance frequency of the second torsion bars 116 and 118. In short, the moving plate 102 is driven two-dimensionally.

The moving plate 102 is vibrated about both the first and second axes by the resonant vibration of the torsion bars corresponding to the respective axes. Therefore, the high-frequency component does not induce any vibration about the axis on the low-speed driving side of the moving plate 102, whereas the low-frequency component does not induce any vibration about the axis on the high-speed driving side of the moving plate 102.

The deflection angles of the moving plate 102 vibrated about the first and second axes can be adjusted by varying the length and the number of turns of the driving coil opposed to the permanent magnet, an interval between the permanent magnet and its opposing driving coil, the intensity of the magnetic field of the permanent magnet and the length of the permanent magnet, the amplitude of the alternating current flowing through the driving coil, and the like.

An alternating signal containing the above high and low-frequency components is generated by simply superposing a high-frequency signal having a frequency suitable for high-speed vibration and a low-frequency signal suitable for low-speed vibration. However, a more suitable alternating current is an alternating current in which an envelope connecting the peaks of the high-frequency components corresponding to the high-speed vibration, as shown in FIG. 4 or 5.

Figure 4:
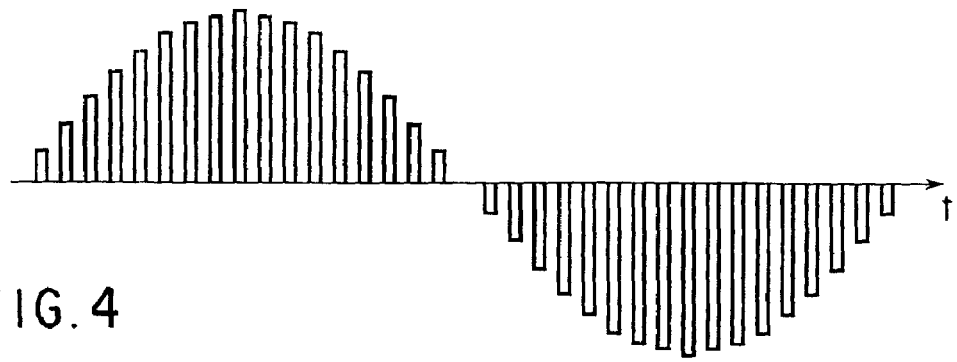
FIG. 4 shows a waveform of an alternating current containing high and low frequency components that are suitable for driving the actuator shown in FIG. 1.
Figure 5:
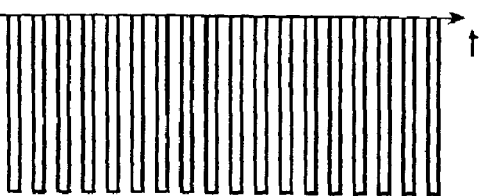
FIG. 5 shows a waveform of another alternating current containing high and low frequency components that are suitable for driving the actuator shown in FIG. 1.

In the alternating current shown in FIG. 4, the peaks of the high-frequency components vary gradually and periodically and the low-frequency components formed of an envelope connecting the peaks take a sinusoidal waveform. In the alternating current shown in FIG. 5, the peaks of the high-frequency components vary periodically in a binary manner and the low-frequency components formed of an envelope connecting the peaks take a rectangular waveform. In FIGS. 4 and 5, the envelope takes a sinusoidal waveform or a rectangular waveform; however, the present invention is not limited to these waveforms. The envelope may take another periodical waveform such as a triangular waveform.

The actuator 100 further comprises a first Hall element 152 for detecting an inclination or a deflection angle of the moving plate 102 vibrated about the first axis and a second Hall element 154 for detecting an inclination or a deflection angle of the moving plate 102 vibrated about the second axis.

The first Hall element 152 is located on the moving plate 102, favorably far away from the first axis. The second Hall element 154 is located on the moving plate 102, favorably far away form the second axis.

The first Hall element 152 generates a signal, which corresponds to the inclination of the moving plate 102 vibrated about the first axis, in cooperation with a magnetic field created by the pair of second permanent magnets 136 and 138. The second Hall element 154 generates a signal, which corresponds to the inclination of the moving plate 102 vibrated about the second axis, in cooperation with a magnetic field created by the pair of first permanent magnets 132 and 134. The wiring of the Hall elements is omitted from FIG. 1.

A technique of detecting a vibration position or inclination position of a moving plate using the above-described Hall elements is disclosed in detail in U.S. Pat. No. 6,108,118, which was filed by the same applicant as that of the present application.

In the two-dimensional driving actuator 100 of the first embodiment, since the first and second torsion bars are made of different materials, the resonance frequencies of both the torsion bars can be set independently of each other. The actuator can thus be applied to a laser projector in which the resonance frequencies of torsion bars for the first and second axes widely differ form each other.

According to the foregoing first embodiment, the first torsion bars 112 and 114 have a high resonance frequency and the second torsion bars 116 and 118 have a low resonance frequency. The resonance frequencies of these first and second torsion bars are design parameters that depend upon, for example, the use and objective of the torsion bars. The first torsion bars 112 and 114 may have a low resonance frequency and the second torsion bars 116 and 118 may have a high resonance frequency.

The above first embodiment is an example in which the present invention is applied to an actuator of an electromagnetic driving type. The present invention can be applied to an actuator of an electrostatic driving type. An electrostatic driving type actuator to which the present invention is applied comprises a flat spring structure as described above and an insulating substrate bonded thereto. The flat spring structure includes a first moving electrode provided on the moving plate 102 and a second moving electrode provided on the moving inner frame 104. The insulating substrate includes a recess for providing a space to allow the moving plate and moving inner frame to be vibrated, a pair of first driving electrodes provided on the bottom of the recess that faces the moving plate, and a pair of second driving electrodes provided on the bottom of the recess that faces the moving inner frame. The first moving electrode also serves as a reflection surface. The moving electrode and driving electrodes constitute a driving means of the actuator.

Second Embodiment

A second embodiment of the present invention will now be described with reference to FIG. 6. The second embodiment is directed to an actuator for use in a light deflector that deflects or scans a light beam two-dimensionally. More specifically, the second embodiment is directed to an electrostatic driving type actuator that is capable of two-dimensionally vibrating a moving plate about two axes intersecting at right angles, the moving plate having a reflection surface for reflecting a light beam.

Figure 6:
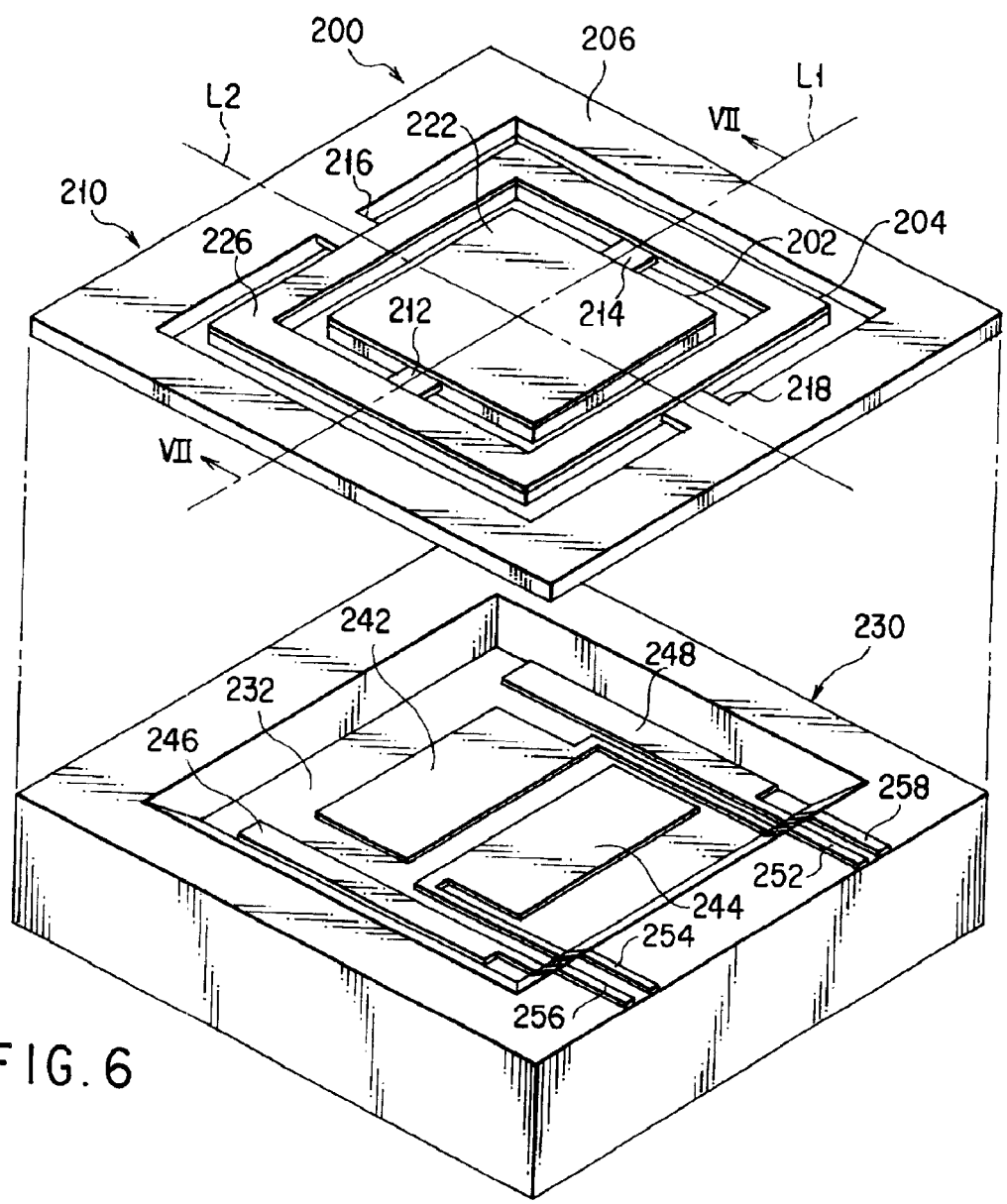
FIG. 6 is an exploded perspective view schematically showing a structure of an actuator according to a second embodiment of the present invention.

As shown in FIG. 6, an actuator 200 comprises a flat spring structure 210. The flat spring structure 210 includes a moving plate 202, a moving inner frame 204 surrounding the moving plate 202, a pair of first torsion bars 212 and 214 coupling the moving plate 202 and moving inner frame 204 to each other, a fixed outer frame 206 surrounding the moving inner frame 204, and a pair of second torsion bars 216 and 218 coupling the moving inner frame 204 and fixed outer frame 206 to each other. The flat spring structure 210 is produced from a single semiconductor substrate by micromachining, for example.

The pair of first torsion bars 212 and 214 supports the moving plate 202, allowing the moving plate 202 to be vibrated about a first axis $L_1$ relative to the moving inner frame 204. On the other hand, the pair of second torsion bars 216 and 218 supports the moving inner frame 204, allowing the moving inner frame 204 to be vibrated about a second axis $L_2$.

The first and second axes $L_1$ and $L_2$ both pass the center of the moving plate 202, extending not in parallel to each other, e.g., intersecting at right angles. Therefore, the moving plate 202 can be vibrated about the second axis $L_2$ together with the moving inner frame 204 relative to the fixed outer frame 206 and solely vibrated about the axis $L_1$ with respect to the moving inner frame 204. In other words, the moving plate 202 can be directed in an arbitrary direction within a given range of angle to the fixed outer frame 206.

The actuator 200 includes an electrode 222 provided on the moving plate 202 and an electrode 226 provided on the moving inner frame 204. The electrode 222 serves as a reflection surface for reflecting a light beam.

The actuator 200 further comprises an insulating substrate 230 bonded to the flat spring structure 210 in order to support the structure 210. The insulating substrate 230 includes a recess for providing a space to allow the moving plate 202 and moving inner frame 204 to be vibrated and a plurality of driving electrodes 242, 244, 246, and 248 on the bottom of the recess 232. The driving electrodes 242 and 244 face the moving plate 202 and the driving electrodes 246 and 248 face the moving inner frame 204.

Wiring patterns 252, 254, 256 and 258 extend from their respective driving electrodes 242, 244, 246, and 248. The wiring patterns 252, 254, 256, and 258 each have a line width that is smaller than that of its corresponding one of the driving electrodes 242, 244, 246, and 248.

An operation of the actuator 200 will now be described in brief.

The electrode 222 on the moving plate 202 and the electrode 226 on the moving inner frame 204 are maintained at a fixed potential, e.g., a ground potential. The driving electrodes 242 and 244 are provided with sinusoidal potentials, which have an offset potential and whose amplitudes are equal to each other and phases are shifted 180 degrees.

Electrostatic attraction is caused between the electrode 222 on the moving plate 202 and the driving electrodes 242 and 244 on the insulating substrate 230 in accordance with a difference in potential between the electrodes. Since the potentials of the driving electrodes 242 and 244 vary sinusoidally with a 180-degree phase shift from each other, the moving plate 202 receives a couple about the axis $L_1$, the couple having a direction interchanging periodically. The moving plate 202 is repeatedly vibrated about the axis $L_1$ in a fixed cycle. The greatest inclination of the moving plate 202 and the cycle of vibration of the moving plate about the axis $L_1$ depend upon the amplitude and frequency of a sinusoidal wave supplied to the driving electrodes 242 and 244.

The driving electrodes 246 and 248 are supplied with sinusoidal potentials, which have an offset potential and whose amplitudes are equal to each other and phases are shifted 180 degrees. The frequency of the sinusoidal potential is much lower than that of the above-described sinusoidal potential applied to the driving electrodes 242 and 244.

Electrostatic attraction is caused between the electrode 226 on the moving inner frame 204 and the driving electrodes 246 and 248 on the insulating substrate 230 in accordance with a difference in potential between the electrodes. Since the potentials of the driving electrodes 246 and 248 vary sinusoidally with a 180-degree phase shift from each other, the moving inner frame 204 receives a couple about the axis $L_2$, the couple having a direction interchanging periodically. The moving inner frame 204 is repeatedly vibrated about the axis $L_2$ in a fixed cycle together with the moving plate 202. The greatest inclination of the moving inner frame 204 and the cycle of vibration of the moving inner frame about the axis $L_2$ depend upon the amplitude and frequency of a sinusoidal wave supplied to the driving electrodes 246 and 248.

Consequently, a light beam reflected by the electrode 222 of the moving plate 202 is scanned at a relatively high frequency in almost parallel to the plane perpendicular to the axis $L_1$ in accordance with the vibration of the moving plate 202 about the axis $L_1$ and simultaneously scanned at a very low, constant frequency in parallel to the plane perpendicular to the axis $L_2$ in accordance with vibration of the moving plate 202 about the axis $L_2$.

Figure 7:
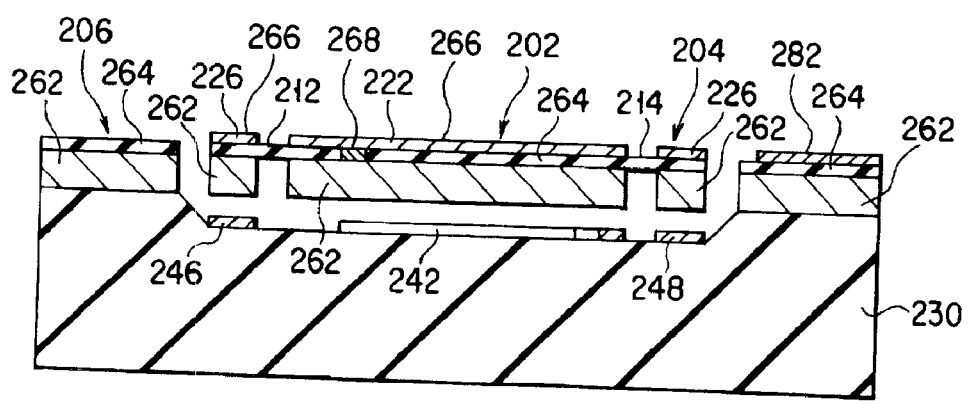
FIG. 7 is a cross-sectional view taken along line VII—VII of FIG. 6.

As illustrated in FIG. 7, the moving plate 202, moving inner frame 204 and fixed outer frame 206 are each composed of a silicon plate 262 and a $SiO_2$ layer or film 264. The first torsion bars 212 and 214 are composed of a $SiO_2$ layer or film 264 and the second torsion bars 216 and 218 (not shown) are composed of a $SiO_2$ layer or film 264 like the first torsion bars 212 and 214.

The moving plate 202 and moving inner frame 204 include a metal film 266 that forms the electrodes 222 and 226. The electrode 222 is electrically connected to a silicon plate 262 via a through hole 268. Similarly, the electrode 226 is electrically connected to the silicon plate 262 formed thereunder via a through hole (not shown). Though the through holes are not particularly essential element, they slightly improve the measurement precision of capacitance.

A method of manufacturing the actuator 200 will now be described in brief.

First, an insulating substrate 230 made of, e.g., fused quartz is prepared. The insulating substrate 230 is selectively etched to a desired depth of, e.g., 25 $\mu$m by reactive ion etching to thereby form a recess 232. A metal film of, e.g., aluminum is formed on the entire surface of the insulating substrate 230 and selectively etched by photolithography to form driving electrodes 242, 244, 246 and 248 and wiring patterns 252, 254 and 256.

Further, a p-type silicon substrate of, e.g., 5000 $\Omega$-cm is prepared as starting material of a silicon plate 262. A thin thermal oxide layer for bonding is provided on the silicon substrate and formed opposite to the recess 232 of the insulating substrate 230. The silicon substrate is bonded to the insulating substrate 230 using a fusion bonding technique. The silicon substrate is ground to a desired thickness of a finished plate. A thermal oxide layer having a thickness of 1000 Å and low-stress silicon nitride having a thickness of 1 $\mu$m are deposited in order on the silicon substrate. When the need arises, the silicon nitride and its underlying thermal oxide layer are selectively etched to form a through hole that penetrates them.

The silicon nitride is selectively etched to pattern the outlines of the moving plate 202, moving inner frame 204, fixed outer frame 206, and torsion bars 212, 214, 216 and 218. Further, chromium-gold electrodes 222 and 226 are formed on the moving plate 202 and moving inner frame 204. Finally, the silicon substrate is subjected to anisotropic etching along the outlines of the moving plate 202, moving inner frame 204, fixed outer frame 206, and torsion bars 212, 214, 216 and 218, using a mixture of hydrofluoric acid, nitric acid and acetic acid, to thereby obtain the actuator 200.

In the electrostatic driving type actuator, the greatest inclination of the moving plate 202 can be obtained based on the capacitance between the electrode 222 and driving electrodes 242 and 244 and that of the moving inner frame 204 can be obtained based on the capacitance between the electrode 226 and driving electrodes 246 and 248.

The capacitance is obtained by superposing a small-amplitude AC voltage having a frequency of, e.g., about 1 MHz, which is much higher than that of a driving wave supplied to the driving electrodes, on the driving wave, using the following equation: capacitance C=dQ/dV where dV is variation in the AC voltage and dQ is variation in the way of the build-up of charges in the driving electrodes.

The electrodes formed on the moving plate 202, moving inner frame 204 and insulating substrate 230 are electrically connected to an external circuit through a wire formed on the fixed outer frame. The wire is schematically drawn in FIG. 7 as a member indicated by reference numeral 282. Such a wire 282 is generally formed by patterning a metal thin film such as aluminum.

In a prior art electrostatic driving type actuator, generally, driving electrodes are provided on both a moving plate and a moving inner frame and a member that supports a flat spring structure includes a silicon substrate. The silicon substrate itself serves as an electrode, and the driving electrodes are electrically connected to an external circuit through a wire formed on the silicon substrate with a thin insulation layer interposed therebetween. Thus, parasitic capacitance is caused between the wire and silicon substrate and decreases the measurement precision of inclination of the moving plate that is obtained by parasitic measurement.

In contrast, in the actuator according to the second embodiment, the driving electrodes 242, 244, 246 and 248 and the wiring patterns 252, 254, 256 and 258 extending therefrom are formed on the insulating substrate 230 and the wiring patterns 252, 254, 256 and 258 have a line width that is smaller than that of the driving electrodes 242, 244, 246 and 248. Therefore, an undesired parasitic capacitance other than the capacitance to be detected between the driving electrodes 242 and 244 and the electrode 222 of the moving plate and the capacitance to be detected between the driving electrodes 246 and 248 and the electrode 226 of the moving inner frame 204, is very small. The electrostatic driving type actuator that is capable of detecting an inclination of the moving plate 202 with high precision by measurement of electrostatic capacitance is provided.

The embodiments have been described specifically with reference to the accompanying drawings. The present invention is not limited to the above embodiments but contain all embodiments that can be made without departing from the scope of the subject matter of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A two-dimensional driving actuator comprising:
a flat spring structure including a moving plate, a moving inner frame surrounding the moving plate, first torsion bars coupling the moving plate and the moving inner frame so as to allow the moving plate to be vibrated relative to the moving inner frame, a fixed outer frame surrounding the moving inner frame, and second torsion bars coupling the moving inner frame and the fixed outer frame so as to allow the moving inner frame to be vibrated relative to the fixed outer frame, the flat spring structure being manufactured from a single semiconductor substrate, and the first and second torsion bars being made of materials different in stiffness; and driving means for driving the flat spring structure.

2. The actuator according to claim 1, wherein the semiconductor substrate comprises a plurality of layers, which are made of materials varying in stiffness, the first torsion bars are chiefly constituted by a layer of a high-stiffness material, and the second torsion bars are chiefly constituted by a layer of a low-stiffness material.

3. The actuator according to claim 1, wherein the semiconductor substrate includes a layer of silicon material and a layer of organic insulating material, the first torsion bars are chiefly constituted by the layer of silicon material, and the second torsion bars are chiefly constituted by the layer of organic insulating material.

4. The actuator according to claim 1, wherein the semiconductor substrate includes a layer of silicon material and a layer of organic insulating material, the first torsion bars are constituted by the layer of silicon material and the layer of organic insulating material, and the second torsion bars are constituted by the layer of organic insulating material.

5. The actuator according to claim 1, wherein the actuator has a first axis and a second axis, the driving means comprises a driving coil rotating around the moving inner frame, a pair of first permanent magnets generating an electromagnetic field parallel to the first axis, and a pair of second permanent magnets generating an electromagnetic field parallel to the second axis.

6. The actuator according to claim 5, wherein the first permanent magnets are arranged on both sides of the flat spring structure in parallel to the second axis, and the second permanent magnets are arranged on both sides of the flat spring structure in parallel to the first axis.

7. The actuator according to claim 1, wherein the actuator further comprises an insulating substrate bonded to the flat spring structure, the insulating substrate has a recess to provide a space, which allows the moving plate and the moving inner frame to be vibrated, and the driving means includes a first moving electrode provided on the moving plate, a second moving electrode provided on the moving inner frame, a pair of first driving electrodes provided on a bottom of the recess of the insulating substrate and opposed to the moving plate, and a pair of first driving electrodes provided on the bottom of the recess of the insulating substrate and opposed to the moving inner frame.

8. A two-dimensional driving actuator comprising:

a flat spring structure including a moving plate, a moving inner frame surrounding the moving plate, first torsion bars coupling the moving plate and the moving inner frame so as to allow the moving plate to be vibrated relative to the moving inner frame, a fixed outer frame surrounding the moving inner frame, second torsion bars coupling the moving inner frame and the fixed outer frame so as to allow the moving inner frame to be vibrated relative to the fixed outer frame, an electrode provided on the moving plate, and an electrode provided on the moving inner frame; and an insulating substrate supporting the flat spring structure, the insulating substrate including a recess to provide a space, which allows the moving plate to be vibrated, a plurality of driving electrodes provided on a bottom of the recess, and a plurality of wiring patterns extending from the driving electrodes, the wiring patterns having a line width smaller than that of the driving electrodes, and the actuator detecting an inclination of the moving plate by checking capacitance of the driving electrodes;

wherein the first and second torsion bars being made of materials different in stiffness.

\* \* \* \* \*